(12) United States Patent
Radhakrishnan et al.

(10) Patent No.: US 11,594,879 B2
(45) Date of Patent: Feb. 28, 2023

(54) MULTI-POWER SUPPLY MONITORING, OPERATION, AND CONTROL

(71) Applicant: Infineon Technologies Austria AG, Villach (AT)

(72) Inventors: Jayadevan Radhakrishnan, San Jose, CA (US); Jens A. Ejury, Fremont, CA (US)

(73) Assignee: Infineon Technologies Austria AG, Villach (AT)

(*) Notice: Subject to any disclaimer, the term of this patent is extended or adjusted under 35 U.S.C. 154(b) by 119 days.

(21) Appl. No.: 16/925,715

(22) Filed: Jul. 10, 2020

(65) Prior Publication Data
US 2022/0014017 A1 Jan. 13, 2022

(51) Int. Cl.
| | |
|---|---|
| *H02M 3/07* | (2006.01) |
| *H02J 1/08* | (2006.01) |
| *G01R 19/165* | (2006.01) |
| *G05F 1/46* | (2006.01) |
| *G06F 1/26* | (2006.01) |
| *G06F 1/28* | (2006.01) |
| *H02M 1/08* | (2006.01) |
| *H02M 3/158* | (2006.01) |
| *H02M 1/00* | (2006.01) |

(52) U.S. Cl.
CPC ........ *H02J 1/084* (2020.01); *G01R 19/16528* (2013.01); *G05F 1/465* (2013.01); *G06F 1/263* (2013.01); *G06F 1/28* (2013.01); *H02J 1/082* (2020.01); *H02M 1/08* (2013.01); *H02M 3/158* (2013.01); *H02M 1/0003* (2021.05)

(58) Field of Classification Search
None
See application file for complete search history.

(56) References Cited

U.S. PATENT DOCUMENTS

| | | | |
|---|---|---|---|
| 5,654,859 A | 8/1997 | Shi | |
| 10,317,969 B1* | 6/2019 | Bodnaruk | G06F 13/385 |
| 2014/0217821 A1 | 8/2014 | Rozman et al. | |
| 2014/0346878 A1* | 11/2014 | Umeyama | H03K 3/012 |
| | | | 307/52 |
| 2018/0229609 A1* | 8/2018 | Hudson | B60L 1/00 |
| 2020/0094758 A1 | 3/2020 | Kawakami | |
| 2020/0216002 A1* | 7/2020 | Mazaki | H02J 7/1423 |

OTHER PUBLICATIONS

Extended European Search Report, EP 21 18 3897, dated Dec. 7, 2021, pp. 1-7.

* cited by examiner

*Primary Examiner* — Thomas J. Hiltunen
(74) *Attorney, Agent, or Firm* — Armis IP Law, LLC

(57) ABSTRACT

An apparatus comprises a first power supply, a second power supply, and a controller. The first power supply supplies a first input voltage to power a first input of a load over a first circuit path. The second power supply supplies a second input voltage to power a second input of the load over a second circuit path. The controller controls connectivity of the first circuit path to the second circuit path as a function of the first input voltage and the second input voltage during at least ramp up or ramp down of either or both of the first input voltage and the second input voltage.

28 Claims, 12 Drawing Sheets

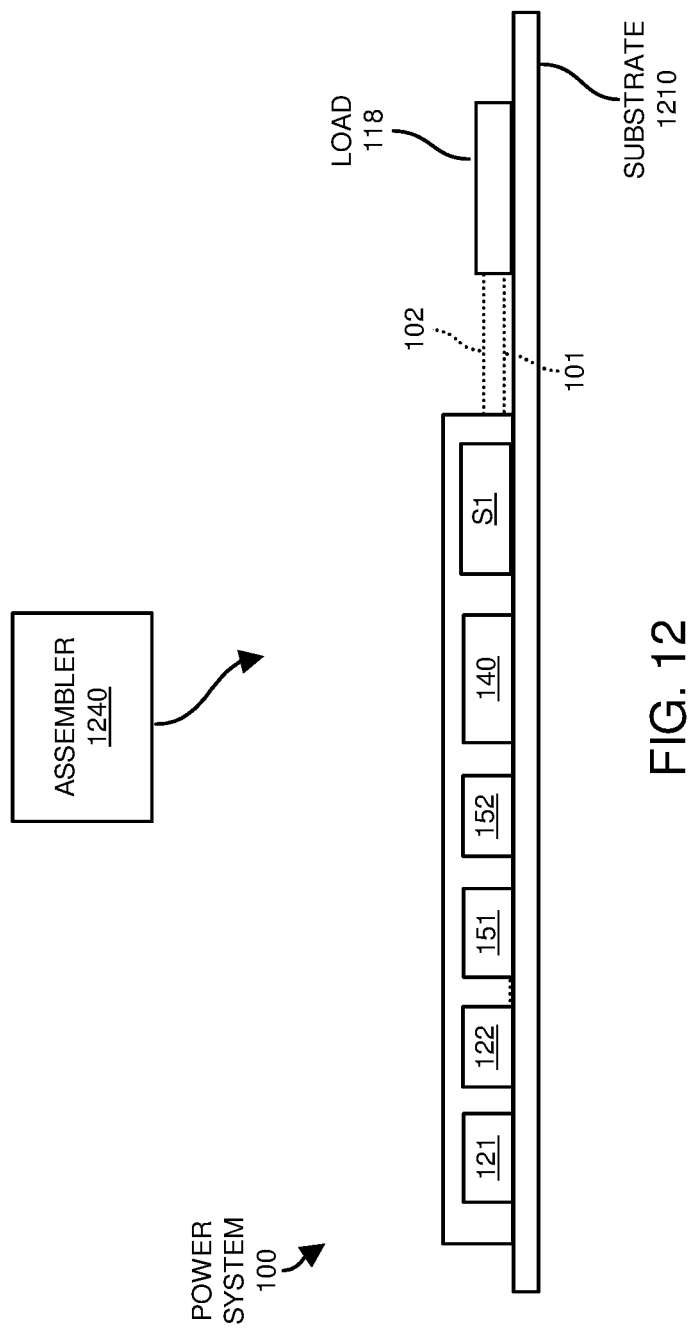

MULTI-POWER SUPPLY MONITORING, OPERATION, AND CONTROL

BACKGROUND

As a result of the ever-increasing need for more processing power and ethernet data traffic, newer circuits such as Ethernet ASICs (Application Specific Integrated Circuits) now require more complex power delivery requirements.

For example, the general trend is toward increasing load current with lower core voltages. In certain instances, a load such as a circuit has a core voltage requirement of 0.75V and up to 2400 Amperes.

Currently, there is no single controller capable of simultaneously driving a sufficient number of power converter phases to deliver appropriate power (such as via 2400 Amperes) to power the load. This means that conventional power supply technology may require two separate asynchronous power converters to supply power to the load.

BRIEF DESCRIPTION

This disclosure includes the observation that conventional power supply monitoring and power supply control techniques suffer from deficiencies. For example, it is not desirable to supply different levels of input voltages from asynchronous power supplies to different input voltage pins of a load as such different input voltage levels may cause damage to a corresponding load.

Embodiments herein include novel ways of tracking and controlling power delivery in a multi-phase power supply simultaneously supplying power to a common load.

More specifically, embodiments herein include an apparatus comprising a first power supply, a second power supply, and a controller. The first power supply supplies a first input voltage to power a first input of a load over a first circuit path. The second power supply supplies a second input voltage to power a second input of the load over a second circuit path. During operation, to ensure simultaneous application of a same input voltage level to input voltage pins of the load from the different power supplies (such as first power supply and second power supply), the controller controls connectivity of the first circuit path to the second circuit path as a function of the first input voltage and the second input voltage.

In one embodiment, the controller controls connectivity (such as via one or more switches) of the first circuit path to the second circuit path as a function of the first input voltage and the second input voltage during ramp up or ramp down of either or both of the first input voltage and the second input voltage. Such embodiments ensure that a same input voltage level is applied to the first circuit path and the second circuit path during startup and shut down of the power supplies.

Further embodiments herein include switch circuitry connected between the first circuit path and the second circuit path. The controller controls activation of the switch circuitry to an ON state during ramping of the first input voltage from the first power supply. Ramping occurs at startup of generating the respective first input voltage and the second input voltage. Ramping also occurs at power down of discontinuing generation of the respective first input voltage and the second input voltage.

In yet further example embodiments, the apparatus as described herein includes switch circuitry (such as one or more switches) connected between the first circuit path and the second circuit path. The controller controls activation of the switch circuitry to an ON state in response to detecting a condition in which a magnitude of the first input voltage is below a first threshold voltage value and a magnitude of the second voltage is below a second threshold voltage value. This ensures that a same voltage is applied to the load at different inputs (such as pins, ports, etc.)

In still further example embodiments, the controller monitors both a magnitude of the first input voltage and a magnitude of the second input voltage during a startup (ramping up) condition of the first power supply producing the first input voltage and the second power supply producing the second input voltage. Depending on detected operating conditions, the controller switches between connecting the first circuit path and the second circuit path and disconnecting the first circuit path from the second circuit path.

For example, in one embodiment, the controller electrically connects the first circuit path and the second circuit path to each other via a low impedance (such as short circuit) path prior to both the first power supply producing the first input voltage above a first threshold value and the second power supply producing the second input voltage above a second threshold value.

Alternatively, in one embodiment, the controller disconnects (provides an open circuit) the first circuit path and the second circuit path subsequent to both the first power supply producing the first input voltage above a first threshold voltage value and the second power supply producing the second input voltage above a second threshold voltage value.

In still further example embodiments, generation of the first input voltage by the first power supply is asynchronous with respect to generation of the second input voltage by the second power supply. More specifically, in one embodiment, the first power supply (such as one or more power supply phases) operates off a different signal clock than the second power supply (such as one or more power supply phases). Control as described herein supports simultaneous input of an input voltage to the load at different inputs even though one of the power supplies may be slower to produce an input voltage to power the load.

In still further example embodiments, the load includes a first input such as first input pins and second input such as second input pins, each of which is configured to receive an input voltage to power different internal circuitry in the load. In one embodiment, the first input includes a first set of multiple input voltage pins, each of which supplies power (via the first input voltage) to a first portion (first circuitry) of the load; and the second input includes a second set of multiple input voltage pins, each of which supplies power (via the second input voltage) to a second portion (first circuitry) of the load. In one embodiment, during power up of the first circuitry and the second circuitry, the first circuitry interacts w the second circuitry.

Further embodiments herein include, via the controller, providing an electrically conductive path between the first circuit path and the second circuit path prior to both or either of the first input voltage being above a first threshold value and the second input voltage being above a second threshold value.

Still further embodiments of the apparatus (or system, device, hardware, etc.) as described herein include one or more field effect transistors (switches). In one embodiment, a field effect transistor directly couples the first circuit path and the second circuit path. The controller controls a state of the field effect transistor as a function of a magnitude of the first input voltage and a magnitude of the second input voltage.

Yet further example embodiments herein include a first switch coupled in series with a second switch between the first circuit path and the second circuit path. The switch includes any number of series switches connected in parallel. The controller produces a common control signal that simultaneously controls both the first switch circuitry and the second switch circuitry to an OFF state subsequent to detecting that both a magnitude of the first input voltage and the second input voltage are above a threshold value. Conversely, the controller produces the common control signal to simultaneously control both the first switch circuitry and the second switch circuitry to an OFF state in response to detecting that both a magnitude of the first input voltage and the second input voltage are above a voltage threshold value. Such an embodiment prevents the power supply outputs from being shorted to each other when they are both up and running.

Accordingly, embodiments herein include providing connectivity between the first circuit path and the second circuit path during ramping of the first power supply and the second power supply. After the first input voltage and the second input voltage are above respective threshold values, the controller electrically disconnects the first circuit path and the second circuit path.

Embodiments herein are beneficial over conventional techniques. For example, the load as described herein can be configured to consume a high amount of current; requiring power from multiple different power supply sources. Instead of implementing complex circuitry to synchronize generation and application of an input voltage from each of multiple sources to different portions of circuitry in a load to ensure mirroring of the input voltages from multiple different power supplies, embodiments herein include implementing supplemental switch circuitry (one or more switches) to ensure that different portions of circuitry in the load are powered at the same time with a same input voltage magnitude even though the power supplies asynchronously generate the input voltages. In other words, during power up and power down of both power supplies and powering the different portions of load, the controller controls the switch circuitry temporarily connects the input voltages from different power supply sources to ensure simultaneous powering until both power supplies produce receive input voltages applied to the load above a threshold value.

These and other more specific embodiments are disclosed in more detail below.

Note that although embodiments as discussed herein are applicable to power supplies and powering a respective load, the concepts disclosed herein may be advantageously applied to any other suitable topologies as well as general power supply control applications.

Note that any of the resources as discussed herein can include one or more computerized devices, mobile communication devices, servers, base stations, wireless communication equipment, communication management systems, workstations, user equipment, handheld or laptop computers, or the like to carry out and/or support any or all of the method operations disclosed herein. In other words, one or more computerized devices or processors can be programmed and/or configured to operate as explained herein to carry out the different embodiments as described herein.

Yet other embodiments herein include software programs to perform the steps and operations summarized above and disclosed in detail below. One such embodiment comprises a computer program product including a non-transitory computer-readable storage medium (i.e., any computer readable hardware storage medium) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, embodiments herein are directed to methods, systems, computer program products, etc., that support operations as discussed herein.

One embodiment herein includes a computer readable storage medium and/or system having instructions stored thereon. The instructions, when executed by computer processor hardware, cause the computer processor hardware (such as one or more co-located or disparately located processor devices) to: monitor a first input voltage supplied to power a first input of a load over a first circuit path; monitor a second input voltage supplied to power a second input of the load over a second circuit path; and control connectivity of the first circuit path and the second circuit path to each other as a function of the first input voltage and the second input voltage.

The ordering of the steps above has been added for clarity sake. Note that any of the processing steps as discussed herein can be performed in any suitable order.

Other embodiments of the present disclosure include software programs and/or respective hardware to perform any of the method embodiment steps and operations summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor (hardware or software), or within an operating system or a within a software application.

As discussed herein, techniques herein are well suited for use in the field of supporting switching power supplies. However, it should be noted that embodiments herein are not limited to use in such applications and that the techniques discussed herein are well suited for other applications as well.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein (BRIEF DESCRIPTION OF EMBODIMENTS) purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section (which is a summary of embodiments) and corresponding figures of the present disclosure as further discussed below.

BRIEF DESCRIPTION OF THE DRAWINGS

FIG. 12 is an example diagram illustrating fabrication of a circuit according to embodiments herein.

Figure 1:
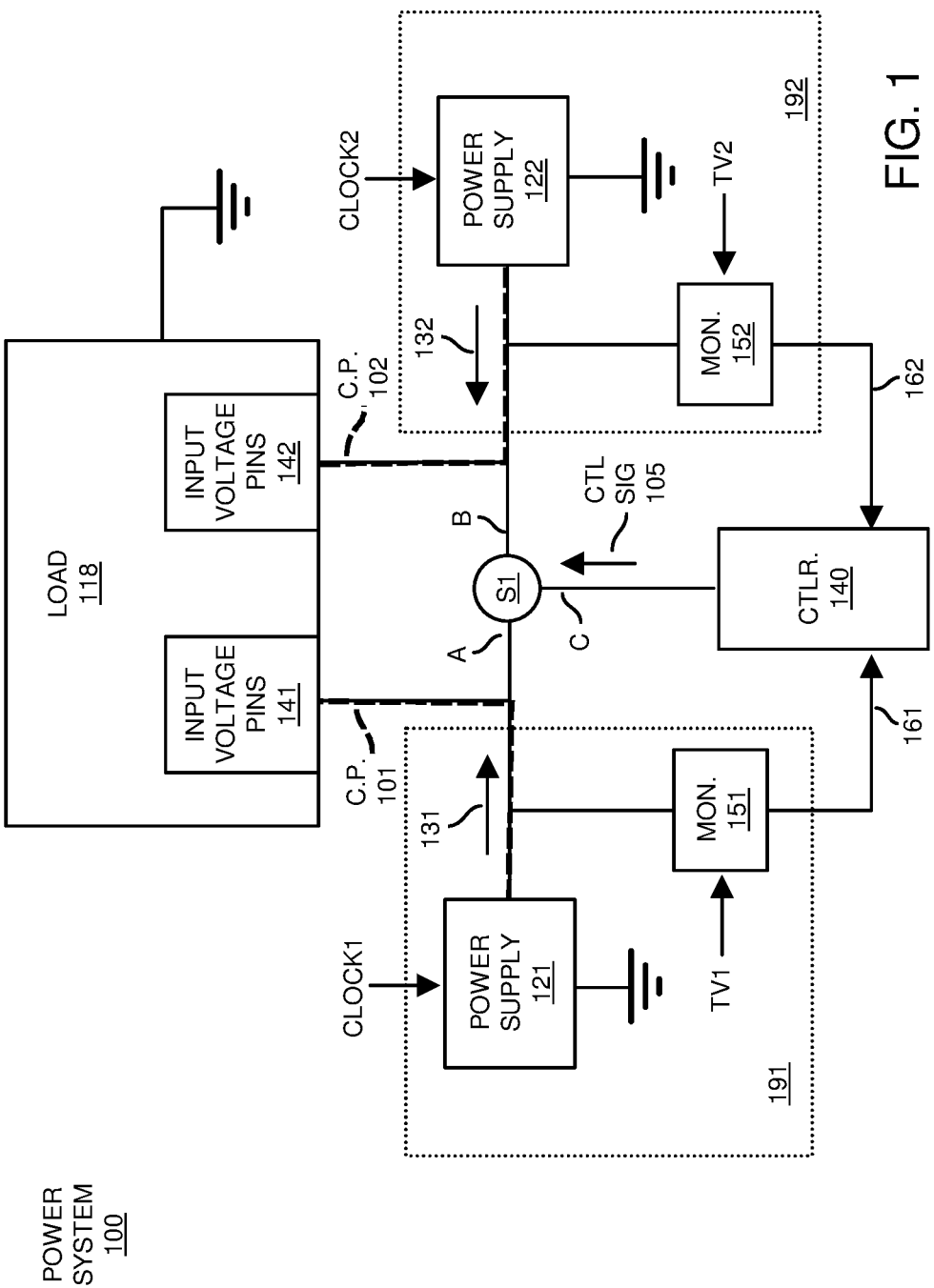
FIG. 1 is an example general diagram of a power supply system supporting input and control of different input voltages to a load according to embodiments herein.

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

Embodiments herein include an apparatus comprising multiple power supplies and a controller. In one embodiment, the multiple power supplies include a first power supply and a second power supply. During operation, the first power supply supplies a first input voltage over a first circuit path to power a first input of a load. The second power supply supplies a second input voltage over a second circuit path to power a second input of the load. The controller controls connectivity of the first circuit path to the second circuit path as a function of the first input voltage and the second input voltage during at least ramp up or ramp down of either or both of the first input voltage and the second input voltage. For example, as further discussed herein, during both ramp-up and ramp down of the first input voltage and the second input voltage, the controller electrically connects the first circuit path and the second circuit path prior to detecting that both the first input voltage and the second input voltage are above a respective threshold value.

Such embodiments ensure that different inputs (such as different sets of input voltage pins of a load) simultaneously receive the same input voltage during both ramp-up and ramp down of the power supplies.

Now, more specifically, FIG. 1 is an example general diagram of a power supply supporting generation and input of different input voltages to a load according to embodiments herein.

In this example embodiment, the power system 100 includes power supply 121 power supply 122, monitor 151, monitor 152, controller 140, switch S1, and load 118.

The load 118 includes any number of inputs to receive power such as multiple input voltages.

For example, in this example embodiment, the load 118 includes a first input 141 such as one or more input voltage pins; the load 118 includes a second input 142 such as one or more input voltage pins.

Load 118 can be configured to include any number inputs to receive respective input voltages. For illustrative sake, the load 118 in FIG. 1 includes two inputs, namely, input 141 and input 142.

As further shown, the power supply 121 produces the input voltage 131 (such as VIN1). The power supply 121 outputs the input voltage 131 to the circuit path 101. Circuit path 101 conveys the input voltage 131 from the power supply 121 to the input 141 of the load 118 as well as the node A of switch S1.

Additionally, the power supply 122 produces the input voltage 132 (such as VIN2). The power supply 122 outputs the input voltage 132 to the circuit path 102. Circuit path 102 conveys the input voltage 132 from the power supply 122 to the input 142 of the load 118 as well as the node B of switch S1.

The state of switch S1 controls an open circuit or short circuit condition between node A and node B of switch S1.

As previously discussed, the power system 100 as described herein further includes monitor 151 and monitor 152. As shown, the monitor 151 monitors the input voltage 131 supplied by the power supply 121 to the input 141 of the load 118. In one embodiment, the monitor 151 compares the magnitude of the input voltage 131 to a respective threshold value TV1. Based upon a comparison of the magnitude of the input voltage 131 to the respective threshold value TV1, the monitor 151 produces the monitor signal 161. The monitor 151 outputs the monitor signal 161 to the controller 140. In one embodiment, the monitor signal 161 indicates whether or not the input voltage 131 is greater than or less than the threshold value TV1.

In a similar manner, the monitor 152 monitors the input voltage 132 supplied by the power supply 122 to the input 142 of the load 118. In one embodiment, the monitor 152 compares the magnitude of the input voltage 132 to a respective threshold value TV2. Based upon a comparison of the magnitude of the input voltage 132 to the respective threshold value TV2, the monitor 152 produces and outputs the monitor signal 162 to the controller 140. In one embodiment, the monitor signal 162 indicates whether or not the input voltage 132 is greater than or less than the threshold value TV2.

As previously discussed, embodiments herein include novel ways of monitoring and controlling simultaneous power delivery from multiple power supplies to a load 118. For example, in one embodiment, the controller 140 monitors the received monitor signal 161 and monitor signal 162. To ensure simultaneous application of the same input voltage level to both input 141 and 142, the controller controls connectivity of the first circuit path 101 to the second circuit path 102 as a function of the first input voltage 131 and the second input voltage 132.

In one embodiment, the first power supply 121 and the second power supply 122 operate asynchronously with respect to each other. For example, in one non-limiting example embodiment, the power supply 121 operates off of a first clock (Clock1); the power supply 122 operates off of a second clock (Clock2).

Additionally, or alternatively, the power supply 121 and power supply 122 operate off the same clock input. However, the power supplies produce the respective input voltages 131 and 132 independently and potentially delayed with respect to each other. In such an instance, a magnitude of the respective input voltage 131 is not always equal to the magnitude of the input voltage 132 on power up and power down. In one embodiment, when both the input voltage 131 in the input voltage 132 are above a threshold value, it is desirable to disconnect the circuit path 101 from the circuit path 102.

In this example embodiment, controlling connectivity of the first circuit path 101 and the second circuit path 102 includes controlling a respective state of the switch S1.

More specifically, as further discussed herein, in response to detecting that the input voltage 131 is less than the threshold value TV1 or detecting that the input voltage 132 is less than the threshold value TV2, the controller 140 controls the switch to an ON state, providing a low impedance path (short circuit path) between the first circuit path 101 and the second circuit path 102.

As previously discussed, in response to detecting a condition in which both the input voltage 131 is greater than the threshold value TV1 and the input voltage 132 is greater than the threshold value TV2, the controller 140 controls the switch S1 to an OFF state, providing a high impedance path (open circuit path) between the first circuit path 101 and the second circuit path 102.

Figure 2:
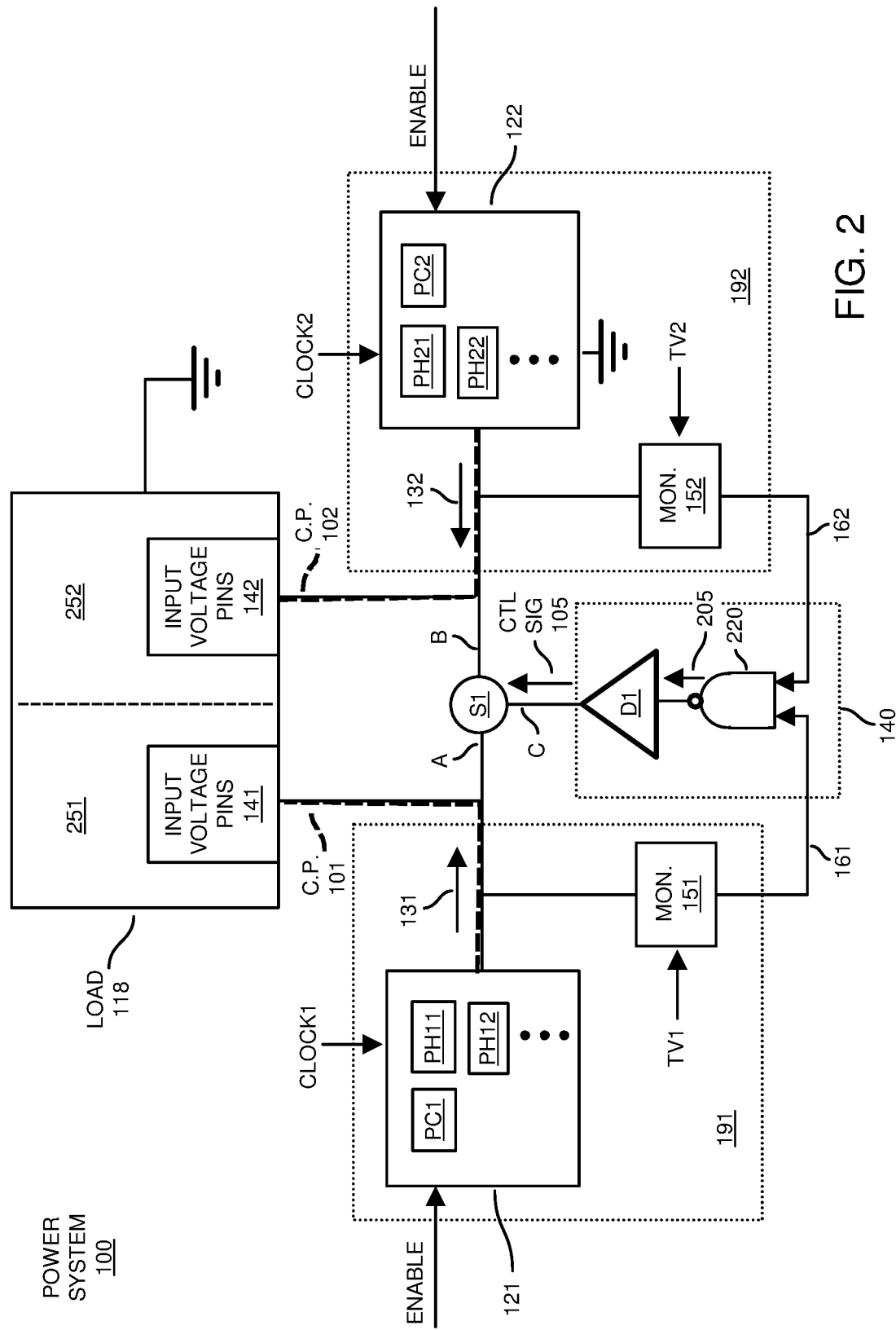
FIG. 2 is an example detailed diagram of a power supply system supporting input and control of different input voltages to a load according to embodiments herein.

FIG. 2 is an example diagram illustrating a controller and corresponding switch circuitry according to embodiments herein.

In this example embodiment, the power supply 121 includes a multiphase controller PC1 and corresponding multiple phases PH11, PH 12, etc. In response to receiving a respective ENABLE signal indicating to generate a respective input voltage 131, the multiphase controller PC1 controls operation of the multiple phases PH11, PH12, etc., to convert a power supply voltage into the respective input voltage 131 (such as 1.0 VDC or other suitable value) supplied to node A of the switch S1 and the input 141.

In one embodiment, the power supply 121 includes thirty-two phases (such as offset phase) that produce the respective input voltage 131. However, the power supply 121 can include any number of phases.

Further in this example embodiment, the power supply 122 includes a multiphase controller PC2 and corresponding multiple phases PH21, PH22, etc. In response to receiving a respective ENABLE signal indicating to generate a respective input voltage 132, the multiphase controller PC2 controls operation of the multiple phases PH21, PH22, etc., to convert a received power supply voltage into the respective input voltage 132 (such as 1.0 VDC or other suitable value) supplied to node B of the switch S1 and the input 142.

In one embodiment, the power supply 122 includes thirty-two phases (such as offset phases) that produce the respective input voltage 132. However, the power supply 122 can include any number of phases.

As further shown in this example embodiment, the controller 140 includes a respective NAND gate 220 as well as driver D1 controlling operation of the switch S1 via driving node C with the control signal 105. The NAND produces control signal 205 based upon respective states of monitor signal 161 and monitor signal 162.

Figure 3:
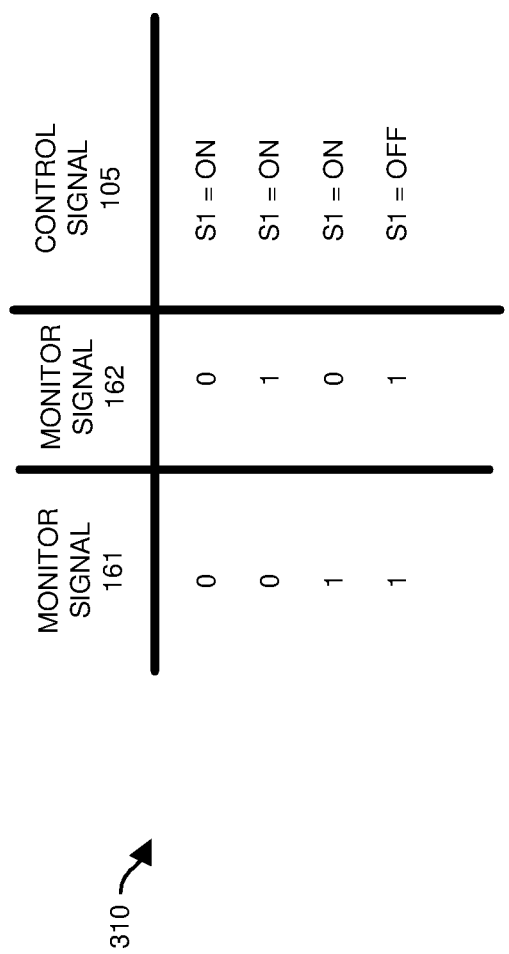
FIG. 3 is an example diagram illustrating a truth table of controlling connectivity of multiple circuit paths according to embodiments herein.

Driver D1 produces the respective control signal 105 to drive node C depending upon the state of the control signal 205 generated by the NAND gate 220. Additional details of generating the respective control signal 205 and control signal 105 and corresponding truth table 310 are shown in FIG. 3.

Referring again to FIG. 2, as previously discussed, the load 118 includes a first input 141 such as first one or more input pins and second input 142 such as second one or more input pins, each of which is configured to receive an input voltage to power circuitry in the load.

More specifically, the load 118 includes input 141 to receive the input voltage 131 generated by the power supply 121. Via input 141, the input voltage 131 powers the first portion 251 (such as first circuitry) of the load 118. The load 118 includes input 142 to receive the input voltage 132 generated by the power supply 122. Via input 142, the input voltage 132 powers the second portion 252 (such as second circuitry) of the load 118.

In one embodiment, the load is a single integrated circuit. Alternatively, the load 118 can include any number of integrated circuits.

As previously discussed, in one embodiment, even though the inputs 141 and 142 of the load 118 are coupled to different circuitry, it is desirable that the same voltage is applied to the different inputs 141 and 142 during ramp-up, ramp down, failure modes, etc., associated with producing the respective input voltages 131 and 132.

Accordingly, in one embodiment, the first input 141 includes a first set of multiple input voltage pins, which collectively supply power (via the first input voltage 131) to a first portion 251 (first set of load circuitry) of the load 118; and the second input 142 includes a second set of multiple input voltage pins, which collectively supply power (via the second input voltage 132) to a second portion 252 (second set of load circuitry) of the load 118.

FIG. 3 is an example diagram illustrating different operational states of controlling connectivity of multiple input voltage paths according to embodiments herein.

As previously discussed, the controller 140 monitors the magnitude of the respective input voltage 131 via monitor signal 161; the controller 140 monitors the magnitude of the respective input voltage 132 via monitor signal 162.

In one embodiment, via the NAND control function supplied by the NAND gate 220, and as indicated by the truth table 310, the controller 140 activates the switch S1 to an ON state (short circuit of circuit path 101 and circuit path 102) in response to detecting that the monitor signal 161 is logic low (corresponding to a condition in which the magnitude of the input voltage 131 is below the threshold value TV1) and monitor signal 162 is logic low (corresponding to a condition in which the magnitude of the input voltage 132 is below the threshold value TV2).

Via the NAND control function supplied by the NAND gate 220, and as indicated by the truth table 310, the controller 140 activates the switch S1 to an ON state (short circuit of circuit path 101 and circuit path 102) in response to detecting that the monitor signal 161 is logic low (corresponding to a condition in which the magnitude of the input voltage 131 is below the threshold value TV1) and monitor signal 162 is logic high (corresponding to a condition in which the magnitude of the input voltage 132 is above the threshold value TV2).

Via the NAND control function supplied by the NAND gate 220, and as indicated by the truth table 310, the controller 140 activates the switch S1 to an ON state (short circuit of circuit path 101 and circuit path 102) in response to detecting that the monitor signal 161 is logic high (corresponding to a condition in which the magnitude of the input voltage 131 is above the threshold value TV1) and monitor signal 162 is logic low (corresponding to a condition in which the magnitude of the input voltage 132 is below the threshold value TV2).

Activation of the respective switch S1 for the above 3 states (00, 01, and 10) ensures that a same voltage is applied to the load 118 at the different inputs 141 and 142 (such as pins, ports, etc.) when either or both of the input voltages are below a respective threshold value.

Via the NAND control function supplied by the NAND gate 220, and as indicated by the truth table 310, the controller 140 deactivates the switch S1 to an OFF state (open circuit between circuit path 101 and circuit path 102) in response to detecting that the monitor signal 161 is logic high (corresponding to a condition in which the magnitude of the input voltage 131 is above the threshold value TV1) and monitor signal 162 is logic high (corresponding to a condition in which the magnitude of the input voltage 132 is above the threshold value TV2).

Deactivation of the respective switch S1 for the final state (11) ensures that the outputs of the power supplies 121 and 122 are not shorted to each other (i.e., circuit path 101 is not connected to circuit path 102) during a condition in which their respective magnitudes are above the operating threshold values TV1 and TV2.

Note that the status of the input voltages 131 and 132 can change over time. For example, the input voltage 131 may be above or below the threshold value TV1; the input voltage 132 may be above or below the threshold value TV2. In accordance with the detected operating conditions (magnitudes of input voltages 131 and 132) as indicated by table 310, via switch S1 and corresponding control, the controller 140 switches between connecting the first circuit path 101 and the second circuit path 102 and disconnecting the first circuit path 101 and the second circuit path 102.

Figure 4:
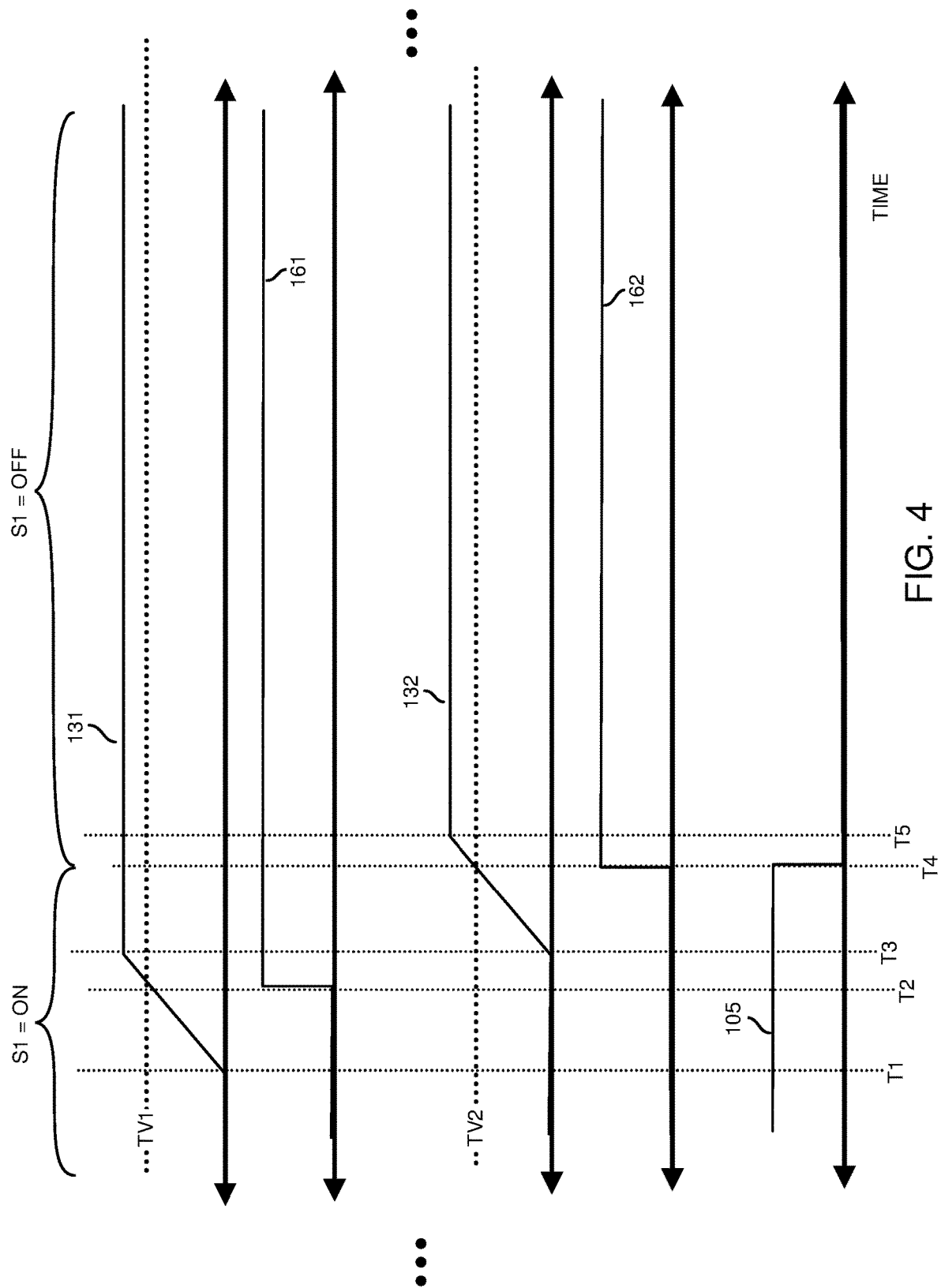
FIG. 4 is an example timing diagram of multiple ramping up power supplies and corresponding control of switch connectivity according to embodiments herein.

FIG. 4 is an example timing diagram illustrating input voltage control during ramp-up of multiple power supplies according to embodiments herein.

As shown in this example embodiment, the controller 140 controls connectivity (such as via one or more switches associated with S1) of the first circuit path 101 to the second circuit path 102 as a function of the first input voltage 131 and the second input voltage 132 during ramp up of either or both of the first input voltage 131 and the second input voltage 132. Such embodiments ensure that a same input voltage level is applied to the first circuit path 101 (and input 141) and the second circuit path 102 (and input 142) during startup of the power supplies 121 and 122.

For example, the controller 140 monitors both a magnitude of the first input voltage 131 and a magnitude of the second input voltage 132 during a startup (ramping up) condition of the first power supply 121 producing the first input voltage 131 and the second power supply 122 producing the second input voltage 132.

Prior to time T1, input voltage 131 is below the threshold value TV1; input voltage 132 is below the threshold value TV2. In such an instance, the monitor signal 161 and monitor signal 162 are both a logic low. The logic low states cause the controller 140 to produce the control signal 105 as a logic high, activating switch S1 to a short circuit (ON) state, connecting the circuit path 101 to the circuit path 102.

Between time T1 and time T4, the magnitude of the input voltage 132 is below the threshold value TV2. This causes the controller 140 to activate the switch S1. Because the switch S1 is ON, the input voltage 131 supplies power via input voltage 131 to both the first input 141 and the second input 142 of the load 118. In other words, via switch S1, the input voltage 131 is conveyed to the second input 142 of the load 118.

Note further that prior to time T2, the input voltage 131 is below the threshold value TV1. In such an instance, the load 118 is not properly powered. However, between time T2 and time T4, the input voltage 131 is above the threshold value TV1. In such an instance, the load 118 and corresponding input 141 and input 142 are powered with a single input voltage 131. In one embodiment, the input voltage 131 allows the load 118 to operate in at least a sleep mode or a low power mode as the power supply 121 may not be able to supply sufficient current for the load 118 to operate in a maximum power consumption mode.

After time T4, a magnitude of the input voltage 132 also increases above the threshold value TV2. In such an instance, the controller 140 deactivates the switch S1; the power supply 121 supplies power to the first input 141 of the load 118 independent of the power supply 122 supplying input voltage 132 to the second input 142 of the load 118. In such an instance, the load 118 is able to operate in a maximum power consumption mode because both input voltage 141 and input voltage 142 supply current to the dynamic load 118.

Figure 5:
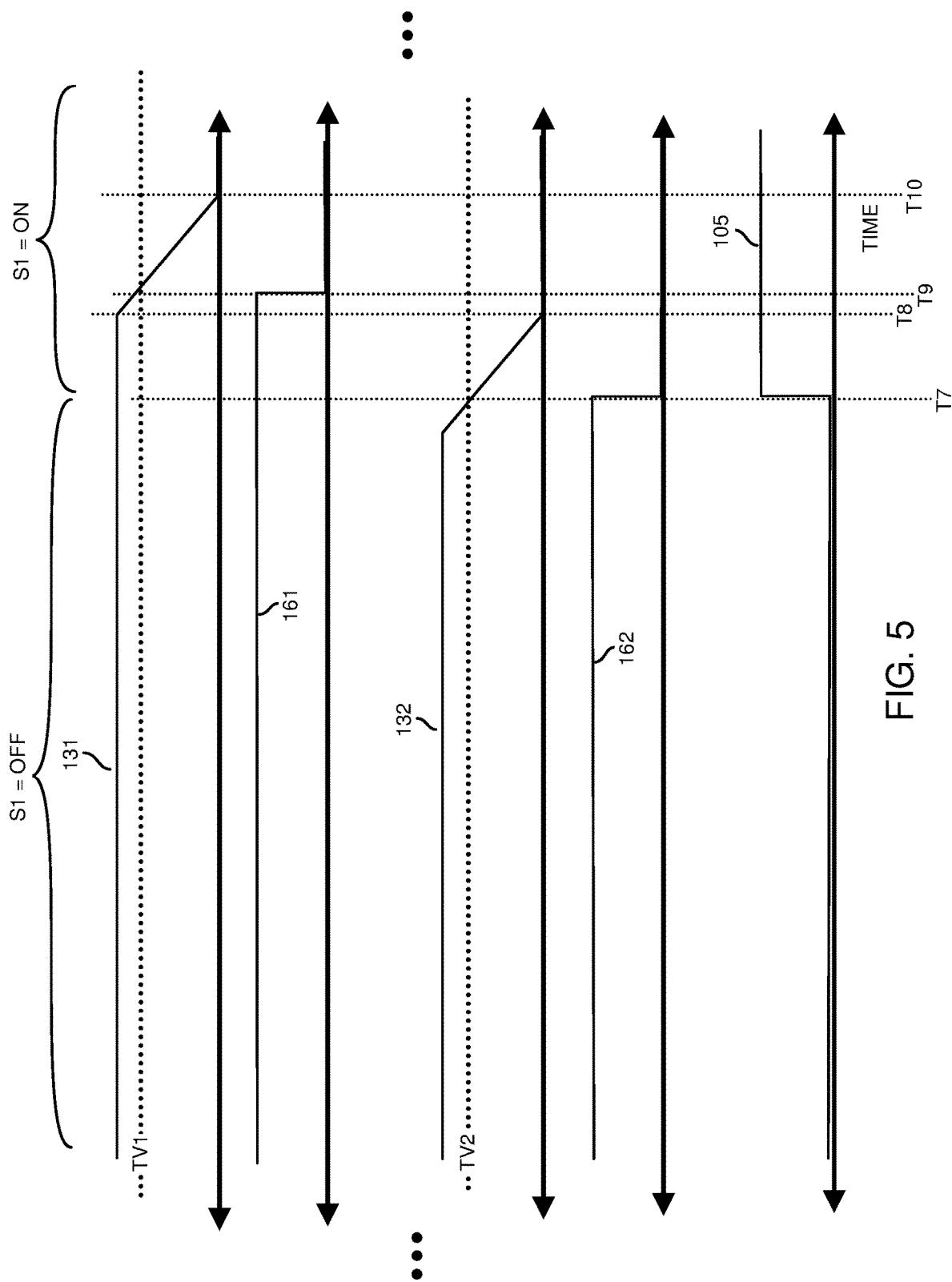
FIG. 5 is an example timing diagram of multiple ramping down power supplies and corresponding control of switch connectivity according to embodiments herein.

FIG. 5 is an example timing diagram illustrating input voltage control during ramp-down of multiple power supplies according to embodiments herein.

As shown in this example embodiment, the controller 140 controls connectivity (such as via one or more switches associated with S1) of the first circuit path 101 to the second circuit path 102 as a function of the first input voltage 131 and the second input voltage 132 during ramp down of either or both of the first input voltage 131 and the second input voltage 132. Such embodiments ensure that a same input voltage level is applied to the first circuit path 101 (and input 141) and the second circuit path 102 (and input 142) during shut down of the power supplies 121 and 122.

For example, the controller 140 monitors both a magnitude of the first input voltage 131 and a magnitude of the second input voltage 132 during a shut-down (ramping down) condition of the first power supply 121 producing the first input voltage 131 and the second power supply 122 producing the second input voltage 132.

Prior to time T7, input voltage 131 is above the threshold value TV1; input voltage 132 is above the threshold value TV2. In such an instance, the monitor signal 161 and monitor signal 162 are both a logic high. The logic high states cause the controller 140 to produce the control signal 105 as a logic low, deactivating switch S1 to an open circuit (ON) state, disconnecting the circuit path 101 from the circuit path 102.

At time T7, the magnitude of the input voltage 132 falls below the threshold value TV2. In such an instance, the monitor signal 162 switches to a logic low. This causes the controller 140 to activate the switch S1 to an ON state.

Thus, between time T7 and time T10, the magnitude of the input voltage 132 is below the threshold value TV2. This causes the controller 140 to activate the switch S1. Because the switch S1 is ON, the input voltage 131 supplies power via input voltage 131 to both the first input 141 and the second input 142 of the load 118. In other words, via switch S1, the input voltage 131 is conveyed to the second input 142 of the load 118.

Note further that after time T9, the input voltage 131 is below the threshold value TV1. In such an instance, the load 118 is not properly powered. However, between time T7 and time T9, the input voltage 131 is above the threshold value TV1. In such an instance, the load 118 is powered with a single input voltage 131. In one embodiment, the input voltage 131 allows the load 118 to operate in at least a sleep mode or low power consumption to the limit of power supply 121 supplying current via input voltage 131.

Figure 6:
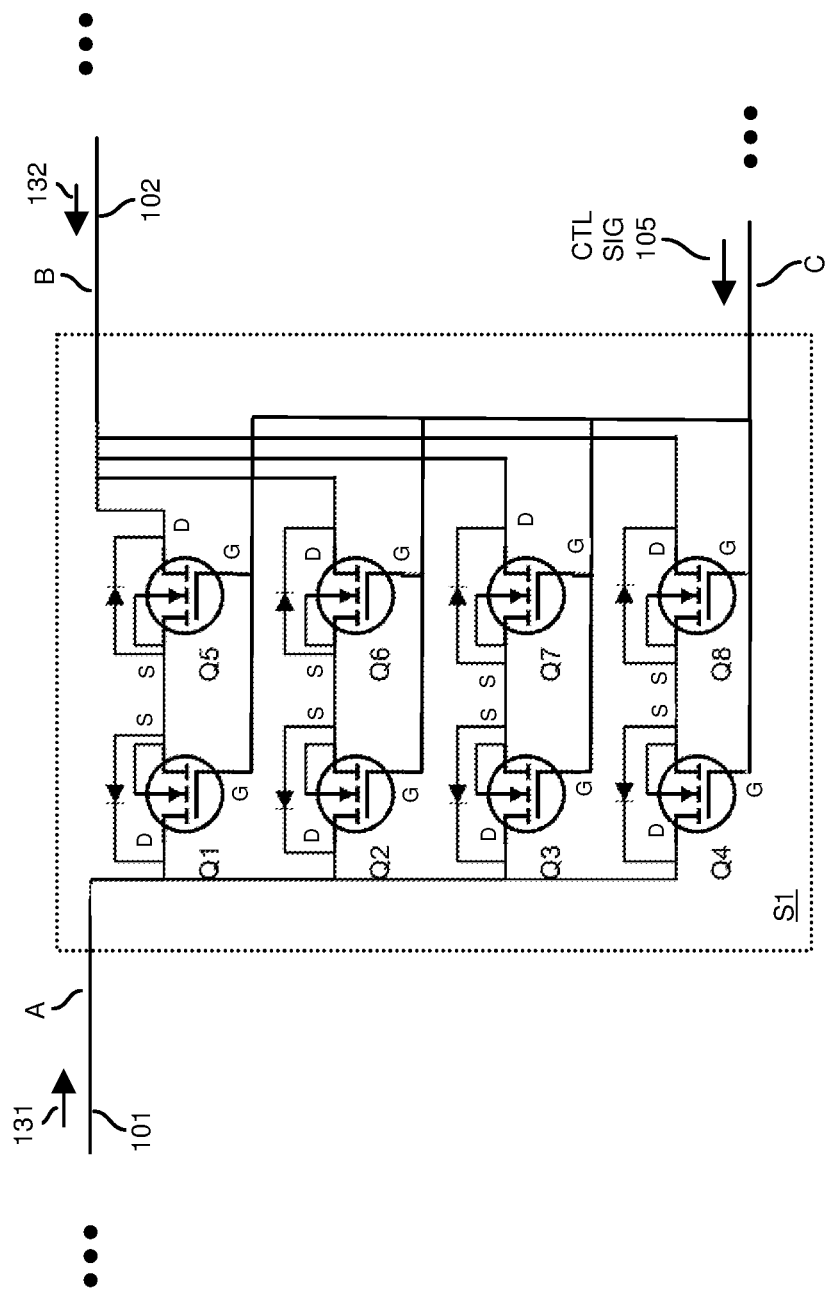
FIG. 6 is an example diagram illustrating switch circuitry according to embodiments herein.

FIG. 6 is an example diagram illustrating switch circuitry according to embodiments herein.

In this example embodiment, the apparatus (such as power system 100) or switch S1 as described herein include one or more field effect transistors (switches).

For example, in this example embodiment, the switch S1 includes multiple switches such as switch Q1, switch Q2, switch Q3, switch Q4, switch Q 5, switch Q6, switch Q7 and switch Q8. Note that the switch S1 can include any number of switches.

As further shown, the series combination of switch Q1 and switch Q5 are coupled between node A and node B of switch S1. For example, the drain node (D) of switch Q1 is connected to node A; the drain node (D) of switch Q5 is connected to node B; the source node (S) of switch Q1 is connected to the source node (S) of switch Q5; each of the gate node (G) of switch Q1 and the gate node (G) of switch Q5 are connected to node C.

In a similar manner, the series combination of switch Q2 and switch Q6 are coupled between node A and node B of switch S1. For example, the drain node (D) of switch Q2 is connected to node A; the drain node (D) of switch Q6 is connected to node B; the source node (S) of switch Q2 is connected to the source node (S) of switch Q6; each of the gate node (G) of switch Q2 and the gate node (G) of switch Q6 are connected to node C.

In a similar manner, the series combination of switch Q3 and switch Q7 are coupled between node A and node B of switch S1. For example, the drain node (D) of switch Q3 is connected to node A; the drain node (D) of switch Q7 is connected to node B; the source node (S) of switch Q3 is connected to the source node (S) of switch Q7; each of the gate node (G) of switch Q3 and the gate node (G) of switch Q7 are connected to node C.

In a similar manner, the series combination of switch Q4 and switch Q8 are coupled between node A and node B of switch S1. For example, the drain node (D) of switch Q4 is connected to node A; the drain node (D) of switch Q8 is connected to node B; the source node (S) of switch Q4 is connected to the source node (S) of switch Q8; each of the gate node (G) of switch Q4 and the gate node (G) of switch Q8 are connected to node C.

In a manner as previously discussed, the controller 140 generates the signal 105 as a logic high voltage (such as greater than 1 VDC) to turn ON the switch S1 and corresponding field effect transistors, connecting the node A and node B. The controller 140 generates the signal 105 as a logic high low (such as around 0 VDC) to turn OFF the switch S1 and corresponding field effect transistors, disconnecting the node A and node B.

Figure 7:
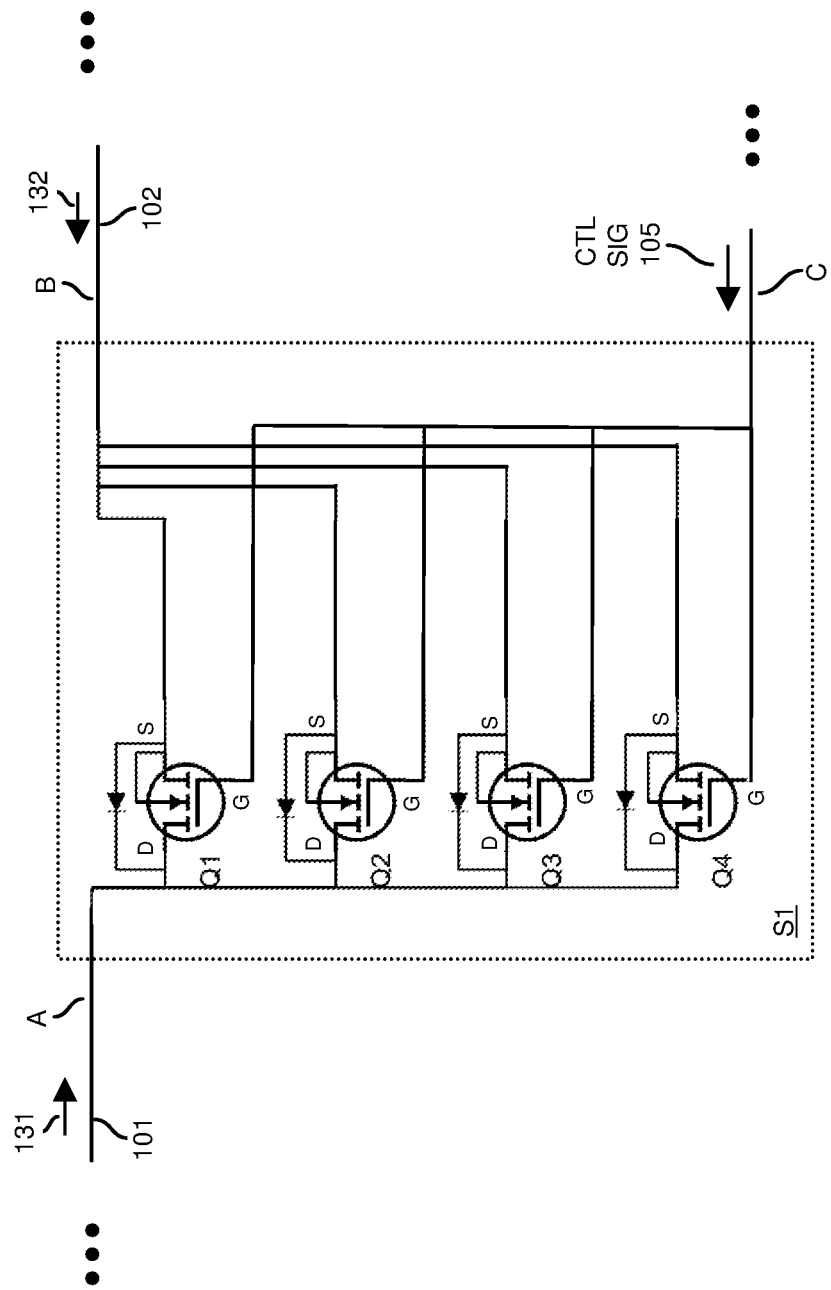
FIG. 7 is an example diagram illustrating switch circuitry according to embodiments herein.

FIG. 7 is an example diagram illustrating switch circuitry according to embodiments herein.

In this example embodiment, the switch S1 includes switches Q1, Q2, Q3, and Q4 disposed in parallel between node A and node B. For example, the drain node (D) of switch Q1 is connected to node A of switch S1; the source node (S) of switch Q1 is connected to node B of switch S1; the gate node (G) of switch Q1 is connected to node C of switch S1.

The drain node (D) of switch Q2 is connected to node A of switch S1; the source node (S) of switch Q2 is connected to node B of switch S1; the gate node (G) of switch Q2 is connected to node C of switch S1.

The drain node (D) of switch Q3 is connected to node A of switch S1; the source node (S) of switch Q3 is connected to node B of switch S1; the gate node (G) of switch Q3 is connected to node C of switch S1.

The drain node (D) of switch Q4 is connected to node A of switch S1; the source node (S) of switch Q4 is connected to node B of switch S1; the gate node (G) of switch Q4 is connected to node C of switch S1.

In a manner as previously discussed, the controller 140 generates the signal 105 as a logic high voltage (such as greater than 1 VDC) to turn ON the switch S1 and corresponding field effect transistors, connecting the node A and node B. The controller 140 generates the signal 105 as a logic high low (such as around 0 VDC) to turn OFF the switch S1 and corresponding field effect transistors, disconnecting the node A and node B.

Figure 8:
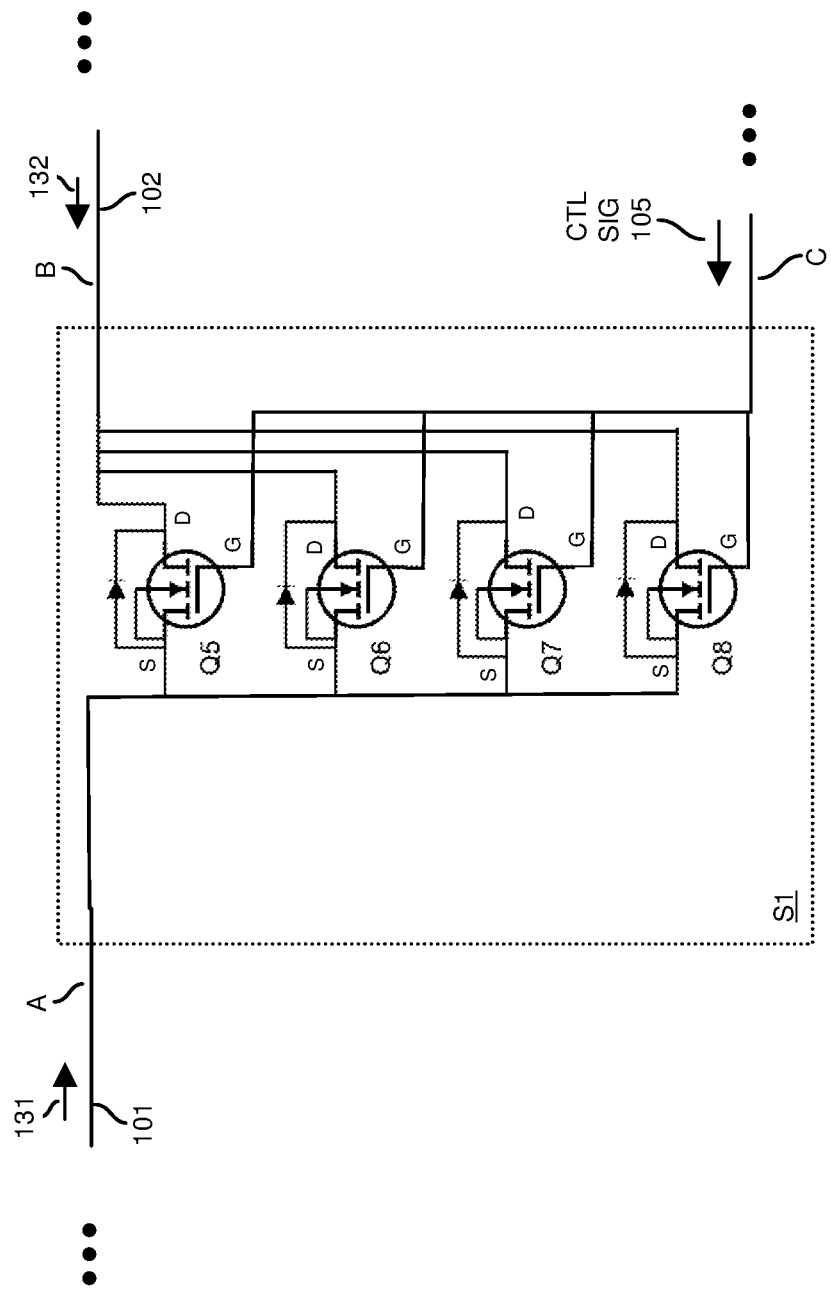
FIG. 8 is an example diagram illustrating switch circuitry according to embodiments herein.

FIG. 8 is an example diagram illustrating switch circuitry according to embodiments herein.

In this example embodiment, the switch S1 includes switches Q5, Q6, Q7, and Q8 disposed in parallel between node A and node B.

For example, the source node (S) of switch Q5 is connected to node A of switch S1; the drain node (D) of switch Q5 is connected to node B of switch S1; the gate node (G) of switch Q5 is connected to node C of switch S1.

The source node (S) of switch Q6 is connected to node A of switch S1; the drain node (D) of switch Q6 is connected to node B of switch S1; the gate node (G) of switch Q6 is connected to node C of switch S1.

The source node (S) of switch Q7 is connected to node A of switch S1; the drain node (D) of switch Q7 is connected to node B of switch S1; the gate node (G) of switch Q7 is connected to node C of switch S1.

The source node (S) of switch Q8 is connected to node A of switch S1; the drain node (D) of switch Q8 is connected to node B of switch S1; the gate node (G) of switch Q8 is connected to node C of switch S1.

In a manner as previously discussed, the controller 140 generates the signal 105 as a logic high voltage (such as greater than 1 VDC) to turn ON the switch S1, connecting the node A and node B. The controller 140 generates the signal 105 as a logic high low (such as around 0 VDC) to turn OFF the switch S1, disconnecting the node A and node B.

Figure 9:
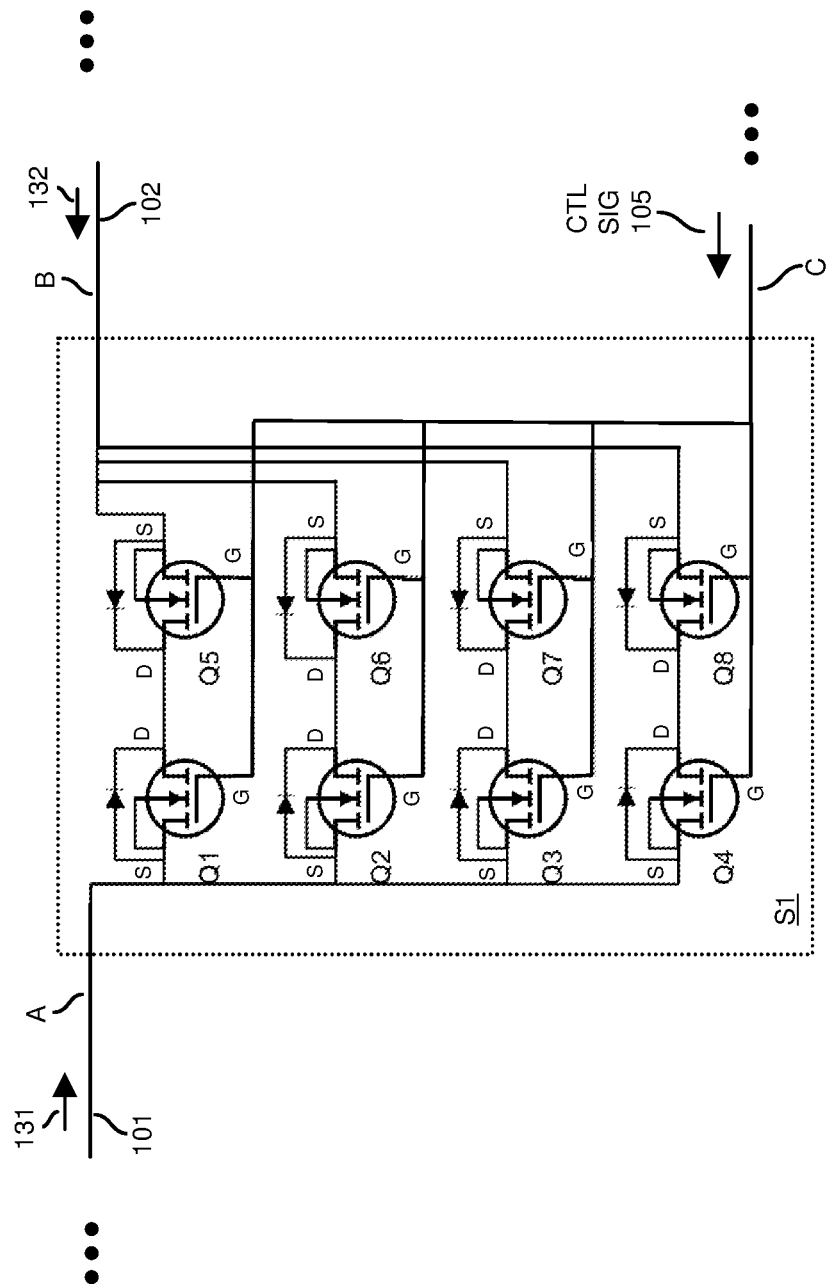
FIG. 9 is an example diagram illustrating switch circuitry according to embodiments herein.

FIG. 9 is an example diagram illustrating switch circuitry according to embodiments herein.

Still further embodiments of the apparatus (such as power system 100) as described herein include one or more field effect transistors (switches).

For example, in this example embodiment, the switch S1 includes multiple switches such as switch Q1, switch Q2, switch Q3, switch Q4, switch Q5, switch Q6, switch Q7 and switch Q8. Note that the switch S1 can include any number of switches.

As further shown, the series combination of switch Q1 and switch Q5 are coupled between node A and node B of switch S1. For example, the source node (S) of switch Q1 is connected to node A; the source node (S) of switch Q5 is connected to node B; the drain node (D) of switch Q1 is connected to the drain node (D) of switch Q5; each of the gate node (G) of switch Q1 and the gate node (G) of switch Q5 are connected to node C.

In a similar manner, the series combination of switch Q2 and switch Q6 are coupled between node A and node B of switch S1. For example, the source node (S) of switch Q2 is connected to node A; the source node (S) of switch Q6 is connected to node B; the drain node (D) of switch Q2 is connected to the drain node (D) of switch Q6; each of the gate node (G) of switch Q2 and the gate node (G) of switch Q6 are connected to node C.

In a similar manner, the series combination of switch Q3 and switch Q7 are coupled between node A and node B of switch S1. For example, the source node (S) of switch Q3 is connected to node A; the source node (S) of switch Q7 is connected to node B; the drain node (D) of switch Q3 is connected to the drain node (D) of switch Q7; each of the gate node (G) of switch Q3 and the gate node (G) of switch Q7 are connected to node C.

In a similar manner, the series combination of switch Q4 and switch Q8 are coupled between node A and node B of switch S1. For example, the source node (S) of switch Q4 is connected to node A; the source node (S) of switch Q8 is connected to node B; the drain node (D) of switch Q4 is connected to the drain node (D) of switch Q8; each of the gate node (G) of switch Q4 and the gate node (G) of switch Q8 are connected to node C.

In a manner as previously discussed, the controller 140 generates the signal 105 as a logic high voltage (such as greater than 1 VDC) to turn ON the switch S1, connecting the node A and node B. The controller 140 generates the signal 105 as a logic high low (such as around 0 VDC) to turn OFF the switch S1, disconnecting the node A and node B.

As previously discussed, embodiments herein are beneficial over conventional techniques. For example, the load 118 as described herein can be configured to consume a high amount of current, requiring power from multiple different power supplies. Instead of implementing complex circuitry to synchronize generation and application of an input voltage from each of multiple power supply sources to different portions of circuitry in the load 118 to ensure mirroring magnitudes of the input voltages 131 and 132, embodiments herein include implementing supplemental switch circuitry S1 (such as via one or more switches) to ensure that different portions of circuitry in the load 118 are powered at the same time with a same input voltage magnitude even though the power supplies (such as power converters) asynchronously generate the input voltages 131 and 132. In other words, during conditions such as power up and power down of both power converters and powering the different portions of load 118, via switch S1, the controller 140 temporarily connects the input voltages 131 and 132 from different power sources to ensure simultaneous powering of the load 118 with one of the input voltages until both power supplies 121 and 122 produce input voltages 131 and 132 to be above one or more threshold values.

Figure 10:
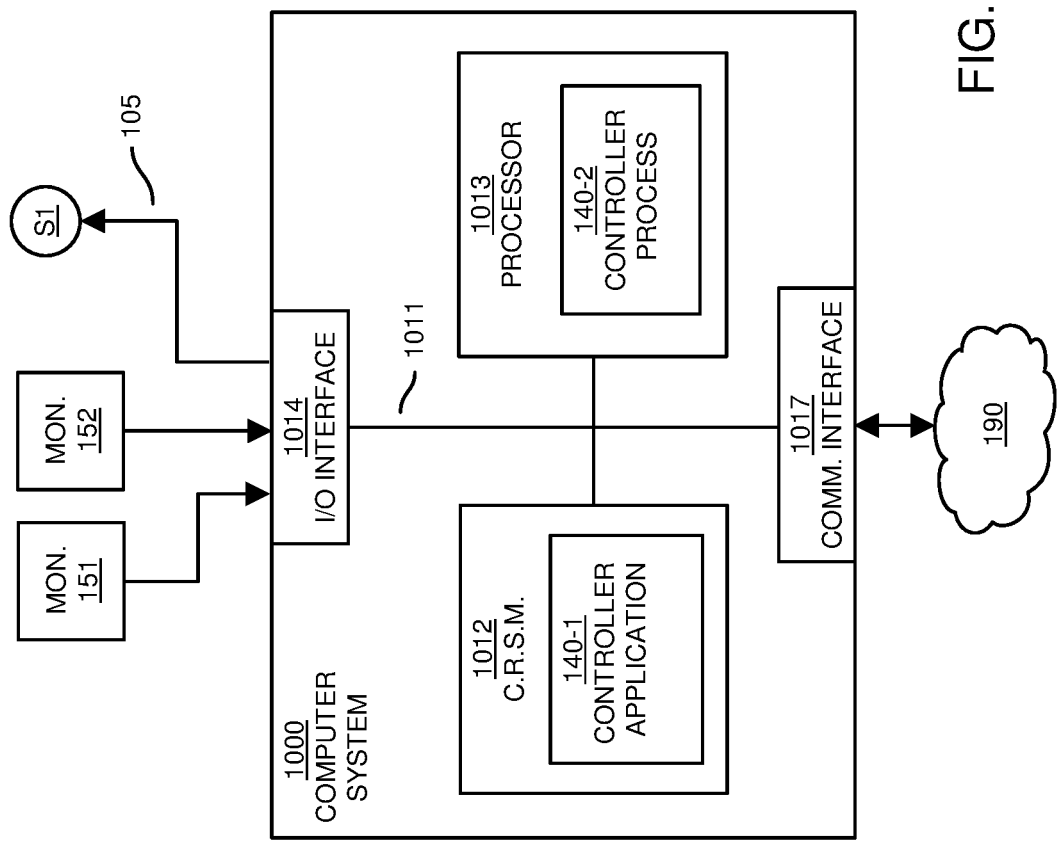
FIG. 10 is an example diagram illustrating computer processor hardware and related software instructions that execute methods according to embodiments herein.

FIG. 10 is an example block diagram of a computer device for implementing any of the operations as discussed herein according to embodiments herein.

As shown, computer system 1000 (such as implemented by any of one or more resources such as controller 140, monitor 151, monitor 152, power supply 121, power supply 122, etc.) of the present example includes an interconnect 1011 that couples computer readable storage media 1012 such as a non-transitory type of media (or hardware storage media) in which digital information can be stored and retrieved, a processor 1013 (e.g., computer processor hardware such as one or more processor devices), I/O interface 1014, and a communications interface 1017.

I/O interface 1014 provides connectivity to any suitable circuitry such as monitor 151, monitor 152, switch S1, etc.

Computer readable storage medium 1012 can be any hardware storage resource or device such as memory, optical storage, hard drive, floppy disk, etc. In one embodiment, the computer readable storage medium 1012 stores instructions and/or data used by the control application 140-1 to perform any of the operations as described herein.

Further in this example embodiment, communications interface 1017 enables the computer system 1000 and processor 1013 to communicate over a resource such as network 190 to retrieve information from remote sources and communicate with other computers.

As shown, computer readable storage media 1012 is encoded with control application 140-1 (e.g., software, firmware, etc.) executed by processor 1013. Control application 140-1 can be configured to include instructions to implement any of the operations as discussed herein.

During operation of one embodiment, processor 1013 accesses computer readable storage media 1012 via the use of interconnect 1011 in order to launch, run, execute, interpret or otherwise perform the instructions in control application 140-1 stored on computer readable storage medium 1012.

Execution of the control application 140-1 produces processing functionality such as control process 140-2 in processor 1013. In other words, the control process 140-2 associated with processor 1013 represents one or more aspects of executing control application 140-1 within or upon the processor 1013 in the computer system 1000.

In accordance with different embodiments, note that computer system 1000 can be a micro-controller device, logic, hardware processor, hybrid analog/digital circuitry, etc., configured to control a power supply and perform any of the operations as described herein.

Functionality supported by the different resources will now be discussed via flowchart in FIG. 11. Note that the steps in the flowcharts below can be executed in any suitable order.

Figure 11:
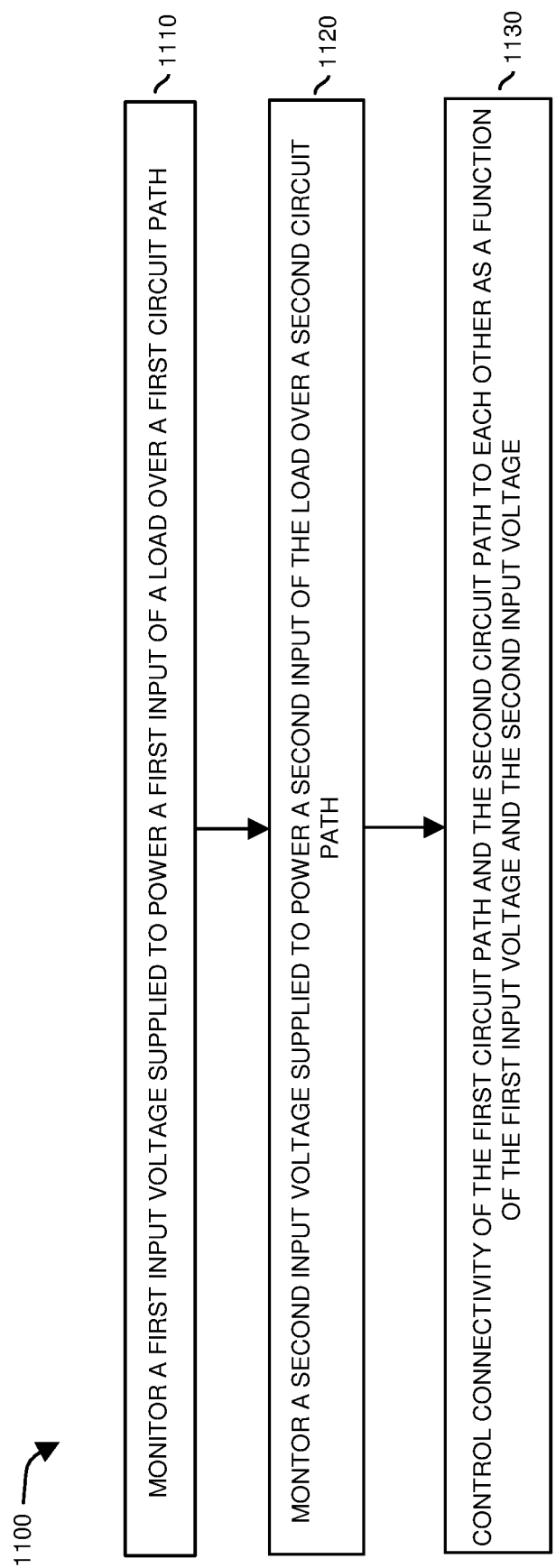
FIG. 11 is an example diagram illustrating a method according to embodiments herein.

FIG. 11 is an example diagram illustrating a method of controlling a power supply according to embodiments herein.

In processing operation 1110, the controller 140 monitors a first input voltage 131 (VIN1) supplied by power supply 121 to power a first input (such as one or more input voltage pins 141) of a load 118 over a first circuit path 101.

In processing operation 1120, the controller 140 monitors a second input voltage 132 (VIN2) supplied by power supply 122 to power a second input (such as one or more input voltage pins) of the load 118 over a second circuit path 102.

In processing operation 1130, the controller 140 controls connectivity of the first circuit path 101 and the second circuit path 102 to each other as a function of the first input voltage 131 and the second input voltage 132.

FIG. 12 is an example diagram illustrating assembly of a power supply circuit on a circuit board according to embodiments herein.

In this example embodiment, assembler 1240 receives a substrate 1210 (such as a circuit board).

The assembler 1240 further affixes (couples) the controller 140 (and one or more corresponding components or system such as power supply 121, power supply 122, monitor 151, monitor, etc., associated with the power system 100) to the substrate 1210.

Via circuit paths (such as one or more traces, electrical conductors, cables, wires, etc.), the assembler 1240 couples the controller 140 and corresponding resources as shown in FIG. 1.

Note that components such as the controller 140, power supply 121, power supply 122, monitor 151, monitor 152, etc., associated with the power system 100 can be affixed or coupled to the substrate 1210 in any suitable manner. For example, one or more of the components in power supply 100 can be soldered to the substrate, inserted into sockets on the substrate 1210, etc.

Note further that the substrate 1210 is optional. Circuit paths may be disposed in cables providing connectivity between the power system 100 and the load 118.

In one nonlimiting example embodiment, the load 118 is disposed on its own substrate independent of substrate 1210; the substrate of the load 118 is directly or indirectly connected to the substrate 1210, etc. The controller 140 or any portion of the power system 100 can be disposed on a standalone smaller board plugged into a socket of the substrate 1210.

Accordingly, embodiments herein include a system comprising: a substrate 1210 (such as a circuit board, standalone board, mother board, standalone board destined to be coupled to a mother board, host, etc.); a power system 100 including corresponding components as described herein; and a load 118. As previously discussed, the load 118 is powered based on conveyance of the input voltage 131 and/or input voltage 132 conveyed over one or more circuit paths 101 and 102 to the load 118.

Note that the load 118 can be any suitable circuit or hardware such as one or more CPUs (Central Processing Units), GPUs (Graphics Processing Unit) and ASICs (Application Specific Integrated Circuits, such those including one or more Artificial Intelligence Accelerators), which can be located on the substrate 1210 or disposed at a remote location.

Note again that techniques herein are well suited for use in circuit applications such as those that implement power control to a load. However, it should be noted that embodiments herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

The invention claimed is:

1. An apparatus comprising:
   a controller operative to:
   monitor a first voltage generated by a first power supply to power a first load;
   monitor a second voltage generated by a second power supply to power a second load;
   control connectivity of a first circuit path and a second circuit path to each other as a function of a magnitude of the first voltage and a magnitude of the second voltage, the first circuit path extending between switch circuitry and the first load, the second circuit path extending between the switch circuitry and the second load, the controlled connectivity including activation of the switch circuitry to an ON-state in response to detecting that the magnitude of the first voltage is less than a first threshold value;
   wherein the switch circuitry includes a first switch circuitry portion and a second switch circuitry portion disposed in series; and,
   wherein the controller is operative to produce a common control signal that simultaneously controls both the first switch circuitry portion and the second switch circuitry portion to an OFF state subsequent to detecting that both the magnitude of the first voltage is above the first threshold value and the magnitude of the second voltage is above a second threshold value the first switch circuitry portion coupled in series with second switch circuitry portion between the first circuit path and the second circuit path.

2. The apparatus as in claim 1, wherein the controller is operative to control activation of the switch circuitry between the first circuit path and the second circuit path to the ON state in response to detecting a condition in which both the magnitude of the first voltage generated by the first power supply is below the first threshold value and the magnitude of the second voltage is below the second threshold value.

3. The apparatus as in claim 1, wherein the controller is further operative to control activation of the switch circuitry connected between the first circuit path and the second circuit path to the ON state during ramping of the magnitude of the first voltage.

4. The apparatus as in claim 1, wherein the controller is further operative to monitor both the magnitude of the first voltage and the magnitude of the second voltage during a startup condition of the first power supply producing the first voltage and the second power supply producing the second voltage.

5. The apparatus as in claim 4, wherein the controller is further operative to directly connect the first circuit path and the second circuit path via the activation of the switch circuitry to the ON-state prior to both the first power supply producing the first voltage above the first threshold value and the second power supply producing the second voltage above the second threshold value.

6. The apparatus as in claim 1, wherein the first voltage produced by the first power supply is generated asynchronously with respect to generation of the second voltage produced by the second power supply.

7. The apparatus as in claim 1, wherein the first load includes a first set of multiple input voltage pins directly coupled to the first circuit path; and
wherein the second load includes a second set of multiple input voltage pins directly coupled to the second circuit path.

8. The apparatus as in claim 1, wherein the controller is operative to provide an electrically conductive path and direct coupling between the first circuit path and the second circuit path prior to both the first voltage being above the first threshold value and the second voltage being above the second threshold value.

9. A system comprising:
a circuit substrate;
the apparatus of claim 1, the apparatus coupled to the circuit substrate.

10. A method comprising:
receiving a circuit substrate; and
coupling the apparatus of claim 1, to the circuit substrate.

11. The apparatus as in claim 1, wherein the controller is further operative to control activation of the switch circuitry connected between the first circuit path and the second circuit path to the ON state during ramping of the magnitude of the first voltage while the magnitude of the second voltage is less than the second threshold value.

12. The apparatus as in claim 1, wherein the activation of the switch circuitry to the ON-state causes the first power supply to power both the first load and the second load with the first voltage during a condition in which the magnitude of the first voltage and the magnitude of the second voltage are un-equal.

13. The apparatus as in claim 1, wherein the activation of the switch circuitry to the ON-state causes the first power supply to power both the first load and the second load with the first voltage during a first condition in which the magnitude of the first voltage is greater than the magnitude of the second voltage and the magnitude of the second voltage is less than the second threshold value.

14. The apparatus as in claim 13, wherein the controller is further operative:
while the magnitude of the first voltage is greater than the first threshold value and powering the first load, deactivate the switch circuitry to an OFF-state in response to detecting a second condition in which the magnitude of the second voltage is greater than the second threshold value.

15. The apparatus as in claim 14, wherein the second voltage is conveyed over the second circuit path to power the second load during the second condition in which the switch circuitry is in the OFF-state.

16. The apparatus as in claim 15, wherein the first voltage is conveyed over the first circuit path to the first load during the second condition.

17. The apparatus as in claim 1, wherein the activation of the switch circuitry to the ON-state causes the first voltage to power both the first load and the second load.

18. The apparatus as in claim 1, wherein the greater of the first voltage and the second voltage powers both the first load and the second load during a first condition in which the switch circuitry is controlled to the ON-state.

19. The apparatus as in claim 18, wherein the switch circuitry is deactivated to an OFF-state during a second condition in which both the magnitude of the first voltage is above the first threshold value and the magnitude of the second voltage is above the second threshold value, the first voltage powering the first load and the second voltage powering the second load during the second condition in which the switch circuitry is deactivated to the OFF-state.

20. A method comprising:
monitoring a first voltage generated by a first power supply to power a first load;
monitoring a second voltage generated by a second power supply to power a second load;
controlling connectivity of a first circuit path and a second circuit path to each other as a function of a magnitude of the first voltage and a magnitude of the second voltage, the controlled connectivity including activation of switch circuitry to an ON-state in response to detecting that either a magnitude of the first voltage is less than a first threshold value or a magnitude of the second voltage is less than a second threshold value, the switch circuitry in the ON-state electrically and directly coupling the first circuit path to the second circuit path;
wherein the switch circuitry includes a first switch circuitry portion and a second switch circuitry portion, the method further comprising:
producing a common control signal that simultaneously controls both the first switch circuitry portion and the second switch circuitry portion to an OFF state subsequent to detecting that both the magnitude of the first voltage is above the first threshold value and the magnitude of the second voltage is above the second threshold value, the first switch circuitry portion coupled in series with second switch circuitry portion between the first circuit path and the second circuit path.

21. The method as in claim 20, wherein controlling connectivity of the first circuit path and the second circuit path includes:
controlling activation of the switch circuitry between the first circuit path and the second circuit path to the ON state in response to detecting a condition in which both a magnitude of the first voltage is below the first threshold value and a magnitude of the second voltage is below the second threshold value, the first circuit path conveying the first voltage to the first load, activation of the switch circuitry to the ON-state conveying the first voltage to the second circuit path to power the second load.

22. The method as in claim 20, wherein controlling connectivity of the first circuit path and the second circuit path includes:
   electrically connecting the first circuit path and the second circuit path to an ON state during ramping of the first voltage.

23. The method as in claim 20, wherein controlling connectivity of the first circuit path and the second circuit path includes:
   monitoring both the magnitude of the first voltage and the magnitude of the second voltage during a startup condition of the first power supply producing the first voltage and the second power supply producing the second voltage.

24. The method as in claim 23, wherein controlling connectivity of the first circuit path and the second circuit path includes:
   electrically connecting the first circuit path and the second circuit path prior to both the magnitude of the first voltage being above the first threshold value and the magnitude of the second voltage being above the second threshold value.

25. The method as in claim 20, wherein generation of the first voltage by the first power supply is asynchronous with respect to generation of the second voltage by the second power supply.

26. The method as in claim 20, wherein the first load includes a first set of multiple input voltage pins coupled to the first circuit path; and
   wherein the second load includes a second set of multiple input voltage pins coupled to the second circuit path.

27. The method as in claim 20, wherein controlling connectivity of the first circuit path and the second circuit path includes:
   providing an electrically conductive path between the first circuit path and the second circuit path prior to both the first voltage being above the first threshold value and the second voltage being above the second threshold value.

28. Computer-readable storage hardware media having instructions stored thereon, the instructions, when executed by computer processor hardware, cause the computer processor hardware to:
   supply a first voltage generated by a first power supply to power a first load;
   supply a second voltage generated by a second power supply to power a second load; and
   control connectivity of a first circuit path and a second circuit path to each other as a function of a magnitude of the first voltage and a magnitude of the second voltage, the first circuit path extending between switch circuitry and the first load, the second circuit path extending between the switch circuitry and the second load, the controlled connectivity including activation of the switch circuitry to an ON-state in response to detecting that the magnitude of the first voltage is less than a first threshold value;
   wherein the switch circa r includes a first, switch circuitry portion and a second switch circuitry portion, the computer processor hardware further operative to:
   produce a common control signal that simultaneously controls both the first switch circuitry portion and the second switch circuitry portion to an OFF state subsequent to detecting that both the magnitude of the first voltage is above the first threshold value and the magnitude of the second voltage is above the second threshold value, the first switch circuitry portion coupled in series with second switch circuitry portion between the first circuit path and the second circuit path.

* * * * *

UNITED STATES PATENT AND TRADEMARK OFFICE
CERTIFICATE OF CORRECTION

PATENT NO. : 11,594,879 B2
APPLICATION NO. : 16/925715
DATED : February 28, 2023
INVENTOR(S) : Jayadevan Radhakrishnan and Jens A. Ejury It is certified that error appears in the above-identified patent and that said Letters Patent is hereby corrected as shown below:

In the Claims

Claim 1, Line 20, replace "and," with --and--

Claim 1, Line 28, replace "value" with --value,--

Claim 28, Line 1, delete "media"

Claim 28, Line 19, replace "circa r" with --circuitry--

Claim 28, Line 19, replace "first," with --first--

Claim 28, Line 27, replace "above the" with --above a--

Signed and Sealed this
Thirtieth Day of May, 2023

*Katherine Kelly Vidal*

Katherine Kelly Vidal
*Director of the United States Patent and Trademark Office*